(12) United States Patent
Brady et al.

(10) Patent No.: US 6,665,161 B1
(45) Date of Patent: Dec. 16, 2003

(54) SEMICONDUCTOR CIRCUIT HAVING INCREASED SUSCEPTIBILITY TO IONIZING RADIATION

(75) Inventors: Frederick T. Brady, San Antonio, TX (US); Murty S. Polavarapu, Vienna, VA (US)

(73) Assignee: BAE Systems Information & Electronic Systems Integration, Inc., Nashua, NH (US)

( * ) Notice: Subject to any disclaimer, the term of this patent is extended or adjusted under 35 U.S.C. 154(b) by 40 days.

(21) Appl. No.: 09/592,473

(22) Filed: Jun. 9, 2000

Related U.S. Application Data
(60) Provisional application No. 60/138,720, filed on Jun. 11, 1999.

(51) Int. Cl.[7] ................................................ G05F 1/40
(52) U.S. Cl. ....................... 361/78; 361/93.1; 307/509
(58) Field of Search ............................ 361/117, 78, 93.1

(56) References Cited

U.S. PATENT DOCUMENTS

| | | | | |
|---|---|---|---|---|
| 4,803,592 A | * | 2/1989 | Ashley ........................ 361/79 |
| 5,107,139 A | * | 4/1992 | Houston et al. ............... 327/18 |
| 5,774,321 A | * | 6/1998 | Kim et al. ..................... 361/94 |
| 6,005,303 A | * | 12/1999 | Hawkes et al. ................ 307/44 |
| 6,140,806 A | * | 10/2000 | Gohara ........................ 323/282 |

* cited by examiner

Primary Examiner—Brian Sircus
Assistant Examiner—Isabel Rodriguez
(74) Attorney, Agent, or Firm—DeMont & Breyer, LLC (57) ABSTRACT

A radiation-susceptible integrated circuit comprises radiation sensor, a differential amplifier and circuit disabler. The radiation sensor includes two devices that have a different tolerance to ionizing radiation. When exposed to a total dose of ionizing radiation that exceeds the radiation tolerance of one of the devices but not the other, only the more radiation-susceptible device will exhibit an increase in leakage current. The differential amplifier is operable to generate an output signal having a value that is indicative of a difference or offset that exists between the output of the two devices. The output signal from the differential amplifier is received by the circuit disabler, which is activated, or not, as a function of the value of the output signal.

27 Claims, 4 Drawing Sheets

SEMICONDUCTOR CIRCUIT HAVING INCREASED SUSCEPTIBILITY TO IONIZING RADIATION

CROSS-REFERENCE TO RELATED APPLICATION

This application claims priority of U.S. Provisional Application No. 60/138,720, filed Jun. 11, 1999, which is incorporated by reference herein.

FIELD OF THE INVENTION

The present invention relates to semiconductor processing and integrated circuits. More particularly, the present invention relates to semiconductor circuits that are susceptible to ionizing radiation.

BACKGROUND OF THE INVENTION

Older semiconductor processing technologies produced integrated circuits that were highly susceptible to damage from ionizing radiation. Such ionizing radiation is emitted from a multitude of galactic sources (e.g., the Sun, etc.) and exists above the ionosphere, and is also emitted when nuclear weapons are detonated. The important consequence of such radiation susceptibility is that these integrated circuits were not well suited for use in satellites or in military applications. They could, therefore, be freely sold and exported without the fear that they would be used militarily against the United States or its allies.

In contrast, some state-of-the-art semiconductor processing technologies currently produce integrated circuits that are highly tolerant to damage from ionizing radiation. Such tolerance results, among any other reasons, from a decrease in semiconductor-feature size (e.g., interconnect line width, etc.) in integrated circuits. In particular, the "gate oxide" or "gate insulator" in field effect transistors (FETs) has thinned to the point where, by virtue of such thinness, it is inherently tolerant to ionizing radiation.

The relatively high radiation tolerance of state-of-the-art circuits is no benefit to most users and for most applications. This characteristic does, however, allow such circuits to be used in aerospace and military applications. In fact, such circuits may be so radiation tolerant that Department of Defense export restrictions (ITAR) are implicated so that such circuits can not be freely sold and exported. To the extent that a commercial CMOS fabricator is restricted from freely exporting its chips, it suffers financially.

Thus, a need exists for semiconductor circuits that exhibit increased susceptibility to ionizing radiation, but that retain the advantages that accrue from contemporary processing methods.

SUMMARY OF THE INVENTION

Some embodiments of the present invention provide semiconductor circuits that have increased susceptibility to ionizing radiation without the costs and disadvantages of techniques in the prior art. In particular, the illustrative embodiment of the present invention is an integrated circuit that possesses the benefits of contemporary processing technologies (e.g., small feature size, etc.) yet is advantageously irreparably damaged by ionizing radiation. Thus, some integrated circuits made in accordance with the present teachings can pass Department of Defense export restrictions and can be freely sold and exported.

In accordance with an illustrative embodiment of the present invention, a radiation-susceptible integrated circuit comprises a radiation sensor, a differential amplifier and a circuit disabler that are operable, collectively, to disable an IC when it is exposed to a sufficient amount of ionizing radiation. The radiation sensor is operable to generate a first signal and a second signal, and the differential amplifier is operable to receive the first and second signals and to generate a third signal having a value that is a function of the first and second signals. The circuit disabler, which is electrically connected to the differential amplifier, is operable to receive the third signal from the differential amplifier and to disable the integrated circuit, or not, responsive to the value of the third signal.

In the illustrative embodiment, the radiation sensor comprises two devices that have a different tolerance to ionizing radiation. In one embodiment, such devices are transistors that have different structures such that they exhibit a different susceptibility to ionizing radiation. When exposed to a total dose of ionizing radiation that exceeds the radiation tolerance of one of the transistors but not the other, only the more radiation-susceptible transistor will exhibit an increase in leakage current.

The differential amplifier receives, as its input, two signals from the radiation sensor. In the illustrative embodiment, those two signals are the output (i.e., the leakage current) from the two devices (e.g., transistors). The differential amplifier is operable to generate an output signal having a value that is indicative of a difference or offset that exists between the input signals. Such an offset results when the IC is exposed to an amount of ionizing radiation sufficient to cause only one of the devices in the radiation sensor to exhibit an increase in leakage current. In one embodiment, the differential amplifier generates a "high"-voltage signal when an offset (increased leakage current from one device) is observed, and a "low"-voltage signal in the absence of an offset.

The output signal from the differential amplifier is received by a circuit disabler. The circuit disabler is activated, or not, as a function of the value of the output signal. For example, a high-voltage output signal from the differential amplifier activates the circuit disabler, while a low-voltage output signal does not. When activated, the circuit disabler is operable to cause the integrated circuit to stop functioning, and preferably causes irreparable damage thereto.

The circuit disabler can be implemented in a variety of ways. For example, in a first embodiment, the circuit disabler comprises a switching FET that shorts power to ground in the IC when activated. In a second embodiment, the circuit disabler comprises a switching FET that shorts signal to ground in the IC when activated. In a third embodiment, the circuit disabler comprises circuitry for disabling the IC's clock driver, and in a fourth embodiment, the circuit disabler comprises circuitry suitable for activating the chip-reset function.

A further illustrative embodiment of the present invention is a method that comprises comparing a first signal indicative of a first current leakage with a second signal indicative of a second current leakage; and generating a third signal having a value that is a function of the difference between the first and second signals. In particular, the third signal has a first value when the difference between the first and second signals meets or exceeds a threshold difference, and has a second value when the difference between the first and second signal is less than the threshold difference. The first and second current leakages are indicative of an amount of radiation exposure. In a further embodiment of the method, an integrated circuit is disabled when the third signal has the first value and is not disabled when the third signal has the second value.

DETAILED DESCRIPTION

For the purposes of this Specification, the terms "circuit" and "device" are used interchangeably, unless other noted.

The terms "radiation susceptible," "radiation intolerant" and "radiation tolerant," are, of course, relative terms. In the context of the illustrated embodiment of the present invention, such relative designations suffice, since it is the difference in radiation susceptibility, rather than absolute tolerance levels, that are important. The following quantitative descriptions of such terms are offered, however, to provide context for these designations. A radiation tolerant device or circuit exhibits a TID tolerance in the range of about 50 to about 200 Krad (Si). A radiation-susceptible or radiation-intolerant device or circuit has a maximum TID tolerance (i.e., the point at which a substantial leakage current is exhibited) of about 50 Krads (Si), and more typically as low as about 1 to 3 Krad (Si). Again, these quantitative descriptions are offered by way of illustration, not limitation. In the context of the present invention, it is the relative, rather than the absolute radiation susceptibility that is of primary importance.

The designation "total" in the phrase "total ionizing dose" signifies that the radiation exposure may occur over a period of time; in other words, TID is a cumulative dose. Furthermore, as the amount of radiation absorbed by different materials for a given exposure varies, radiation tolerance must be referenced to a particular material, such as silicon (Si).

Figure 1:
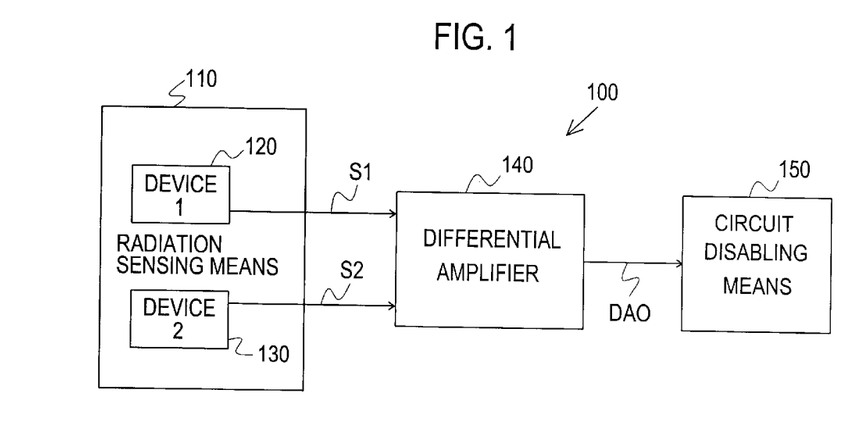
FIG. 1 depicts a portion of an integrated circuit in accordance with the illustrated embodiment of the present invention.

FIG. 1 depicts an embodiment of a radiation-susceptible integrated circuit in accordance with the illustrated embodiment of the present invention. It will be clear to those skilled in the art that integrated circuits typically include many other devices/elements than are depicted in FIG. 1. Such other devices are not shown so that attention can be focused on those elements that are germane to an understanding of the present invention.

As depicted in FIG. 1, illustrative integrated circuit 100 comprises radiation sensor 110, high-gain differential amplifier (e.g., comparator) 140 and circuit disabler 150, which are interrelated as shown. A description of the structure and implementation of various illustrative embodiments of radiation sensor 110 and circuit disabler 150 is deferred until an overview of the inventive circuit is presented.

When a signal that is capable of enabling or activating circuit disabler 150 is received thereby, the circuit disabler disables, preferably permanently, integrated circuit 100. In the illustrative embodiment, the signal that controls whether or not circuit disabler 150 is activated is output signal DAO from differential amplifier 140. In some embodiments, the output DAO of differential amplifier 140 is fed to a second amplification stage (not shown) before feeding it to circuit disabler 150 as may be required to provide appropriate voltages.

Differential amplifier 140 receives, as input, two output signals S1 and S2 from radiation sensor 110. Output signal DAO is a function of the difference between signals S1 and S2.

For example, in one embodiment, when there is substantially no difference or offset between signals S1 and S2, differential amplifier 140 generates a signal having a first value (e.g., a "low" voltage). When there is an offset between signals S1 and S2, differential amplifier 140 generates a signal having a second value (e.g., a "high" voltage). Continuing with the example, when signal DAO has the second value (i.e., when there is an offset between signals S1 and S2), circuit disabler 150 is enabled and operation of integrated circuit 100 is thereby disrupted. When signal DAO has the first value (i.e., when there is no offset between signals S1 and S2), circuit disabler 150 is not enabled and has no effect on the "normal" functioning of integrated circuit 100.

Hereinafter, the term "goes low," as applied to the output DAO of differential amplifier 140, means that as a result of there being essentially no difference between signals S1 and S2, output signal DAO generated by differential amplifier 140 is a low-voltage signal. Also, the term "goes high," as applied to the output DAO of differential amplifier 140, means that as a result of a difference or offset between signals S1 and S2, output signal DAO generated by differential amplifier 140 is a relatively higher-voltage signal. The low-voltage signal is not capable of enabling or activating circuit disabler 150, while the higher-voltage signal does enable the circuit disabler.

As explained further below, an offset between signals S1 and S2 occurs when radiation sensor 110 is exposed to ionizing radiation. To implement such functionality, in one embodiment, radiation sensor 110 comprises first device 120 and second device 130, wherein the second device is more tolerant to ionizing radiation than the first device. First device 120 generates signal S1 and second device 130 generates signal S2.

By way of explanation, when first device 120 receives a cumulative amount of ionizing radiation (e.g., TID) that exceeds its radiation tolerance, an increase in leakage current occurs. As the leakage current of first device 120 increases, a value of signal S1 increases. Since the radiation tolerance of second device 130 has not yet been exceeded, no such increase in leakage current, or in a value of signal S2, occurs. A difference or offset therefore arises between signal S1 and signal S2. Again, it is this difference that ultimately causes circuit disabler 150 to disable integrated circuit 100. Description of the underlying physical phenomena that results in radiation-induced leakage current is described later in this Specification in conjunction with FIGS. 7A–7C.

The first device 120 and second device 130 should be fabricated such their "pre-radiation" current leakage are about equal. Thus, until one of the devices exhibits increased current leakage, the output of differential amplifier 140 goes low, and circuit disabler 150 is inactive.

Circuit Disabler

Those skilled in the art will understand that there are many ways to disable an integrated circuit. By way of illustration, not limitation, four approaches for implementing circuit disabler 150 are described below. An illustrative arrangement for realizing each of the approaches is depicted in FIGS. 2–5.

Figure 2:
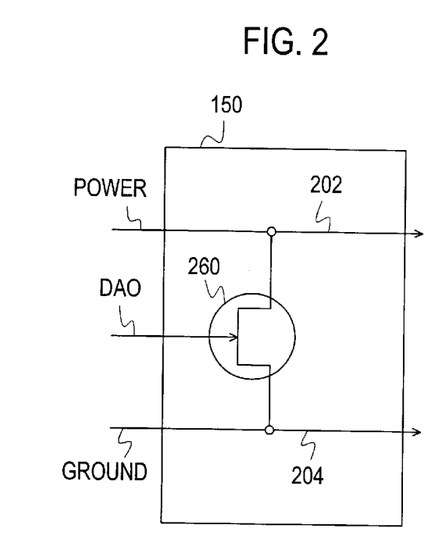
FIG. 2 depicts a first embodiment of a circuit disabler in accordance with the present teachings.

In a first approach, circuit disabler 150 disables an integrated circuit by coupling power to ground. In an illustrative arrangement for coupling to power to ground that is depicted in FIG. 2, circuit disabler 150 comprises a switch, realized in the illustrated embodiment as field effect transistor (FET) 260. The gate of switching FET 260 receives signal DAO from differential amplifier 140 (FIG. 1). The drain of FET 260 is electrically connected to power through electrical conductor 202 and the source of FET 260 is electrically connected to ground through electrical conductor 204. Electrical conductors 202 and 204 can be metal bus lines or specific transistor diffusion nodes, as are well known in the art. It will be clear to those skilled in the art how to make and use electrical conductors 202 and 204 in conjunction with a switch such as FET 260.

When the output of differential amplifier 140 goes low, signal DAO will not turn on switching FET 260 (there is no current flow through the transistor). On the other hand, when the output of differential amplifier 140 goes high, signal DAO will turn on switching FET 260. When switching FET 260 turns on, the switching FET couples power to ground thereby disabling devices in the integrated circuit. The circuit disabler is advantageously designed so that when switching FET 260 turns on, the current flow therethrough is sufficient to "fuse" the bond wire (open), ensuring that current continues to flow. Further disclosure concerning an arrangement wherein switching FETs short power to ground on exposure to ionizing radiation is provided in applicant's co-pending patent application filed on even date herewith as Ser. No. 09/590805 and entitled "Increasing the Susceptibility of Integrated Circuits to Ionizing Radiation", incorporated by reference herein.

Figure 3:
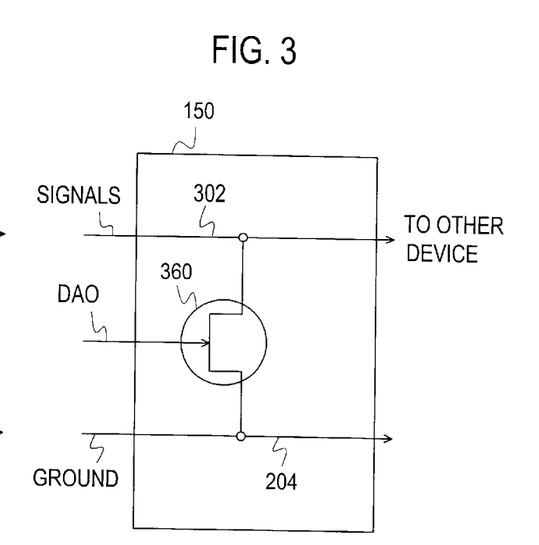
FIG. 3 depicts a second embodiment of a circuit disabler in accordance with the present teachings.

In a second approach, circuit disabling means 150 disables an integrated circuit by coupling information-bearing ("I-B") signals to ground. In an illustrative arrangement for coupling I-B signals to ground that is depicted in FIG. 3, circuit disabler 150 comprises a switch, realized in the illustrated embodiment as field effect transistor (FET) 360. The drain of FET 360 is electrically connected to I-B signal(s) through electrical conductor 302 and the source of FET 360 is electrically connected to ground through electrical conductor 204.

As in the previous embodiment, when the output of differential amplifier 140 goes low, signal DAO will not turn on switching FET 360. When the output of differential amplifier 140 goes high, however, signal DAO will turn on switching FET 360, causing signal(s) in conductor 302 to short to ground. The present embodiment of circuit disabler 150, like the previous embodiment, is advantageously designed so that when switching FET 360 turns on, the current flow therethrough is sufficient to fuse the bond wire ensuring that current continues to flow.

It should be understood that, in most embodiments, the two previously described embodiments of circuit disabler 150 comprise a plurality of switching FETs (rather than one FET as illustrated) that are ganged in parallel. Moreover, in some embodiments, the switch is realized any one of a number of devices other than a FET, including, without limitation, a bipolar transistor, a silicon-controlled rectifier (SCR) and a thyristor or triac.

Figure 4:
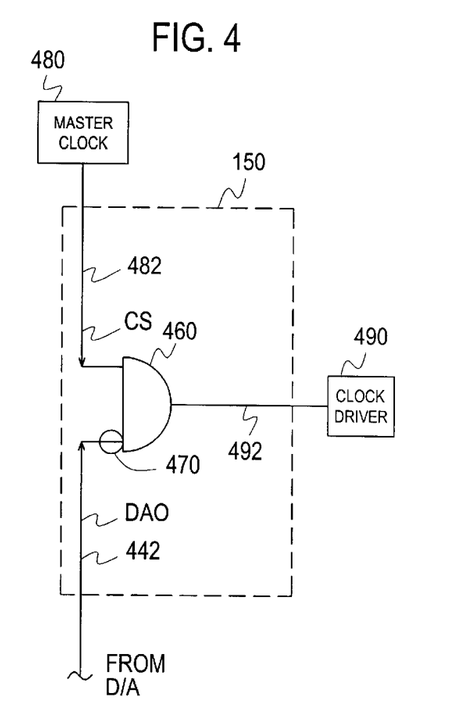
FIG. 4 depicts a third embodiment of a circuit disabler in accordance with the present teachings.

In a third approach, circuit disabler 150 disables an integrated circuit by disabling the clock driver circuit. In an illustrative arrangement for disabling the clock driver circuit that is depicted in FIG. 4, circuit disabler 150 comprises AND gate 460 and three conductors 442, 482 and 492, interrelated as shown. Conductor 482 electrically connects master clock 480 to one input of AND gate 460. Conductor 442 electrically connects the output of differential amplifier 140, which functions as a control signal, to a second input of AND gate 460. Conductor 492 electrically connects the output of AND gate 460 to clock driver 490.

If circuit disabler 150 is to be enabled when the output of differential amplifier 140 goes high (as in the previous examples), then output signal DAO must be inverted in inverter 470 before being fed to AND gate 460. As an alternative, the polarity of the inputs to differential amplifier 140 can be inverted to the same effect.

When the output of differential amplifier 140 is low, AND gate 460 passes clock signal CS to the output (since DAO is inverted) and to clock driver 490 via conductor 492. As such, the operation of the integrated circuit is not disrupted. When the output of differential amplifier 140 goes high, AND gate 460 does not pass clock signal CS to clock driver 492, thereby disabling the integrated circuit.

Figure 5:
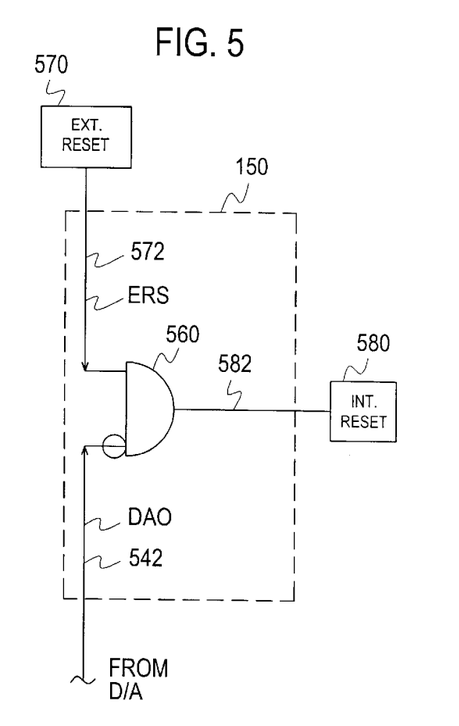
FIG. 5 depicts a fourth embodiment of a circuit disabler in accordance with the present teachings.

In a fourth approach, circuit disabling means 150 disables an integrated circuit by placing the circuit in a "perpetual" reset mode via the circuit's internal reset circuitry. In an illustrative arrangement for asserting reset that is depicted in FIG. 4, circuit disabler 150 comprises OR gate 560 and three conductors 542, 572 and 582, interrelated as shown. Conductor 572 electrically connects external reset 570 to one input of OR gate 560. Conductor 542 electrically connects the output of differential amplifier 140, which functions as a control signal, to a second input of OR gate 560. Conductor 582 electrically connects the output of OR gate 560 to internal reset 580.

When the output of differential amplifier 140 is low, and in the absence of external reset signal ERS, OR gate 560 will not assert reset (i.e., does not pass a signal via conductor 582 to internal reset 580). The "normal" operation of the integrated circuit is therefore not disrupted. When the output of differential amplifier 140 goes high, OR gate 560 asserts reset (i.e., sends a signal to internal reset via conductor 582), thereby disabling the integrated circuit.

As previously described, radiation sensor 110 comprises two devices, one of which devices has a greater tolerance to ionizing radiation than the other. As a consequence, on exposure to ionizing radiation, the less-radiation-tolerant device will typically show an increase in current leakage. It is possible, however, that with continuing exposure to ionizing radiation, the more-radiation-tolerant device will also exhibit an increase in current leakage. It is expected that the less radiation-tolerant device will always show a greater current leakage than the more radiation-tolerant device. There is, however, a possibility that with both devices exhibiting substantial current leakage, the offset between signals S1 and S2 might decrease and the output from differential amplifier 140 may go low.

Such a happenstance will not affect the embodiments utilizing the switching FET, since the current flow fuses the bond wire (open) so that circuit disabler remains enabled regardless of upstream indications. On the other hand, as to the third and fourth approach described above, the circuit disabler may not remain enabled in such a situation. In particular, with reference to FIGS. 4 and 5, a disabled clock driver may be re-enabled, and the reset may be de-asserted, such that the integrated circuit may begin to function again.

Figure 6:
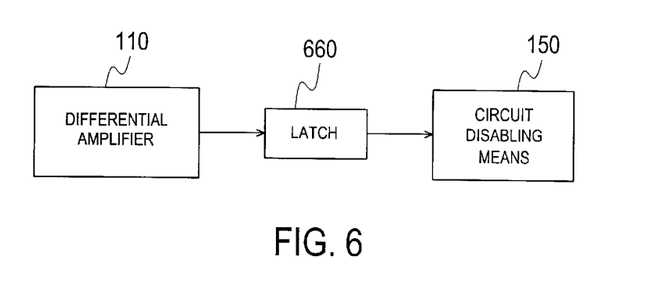
FIG. 6 depicts a further embodiment of an integrated circuit in accordance with the present teachings wherein a latch circuit is electrically connected between a differential amplifier and a circuit disabler.

To prevent such an occurrence, some embodiments of the present invention further comprise a "latch" circuit, such as is depicted conceptually in FIG. 6. In the illustrative embodiment depicted in FIG. 6, latch circuit 660 is fed output signal DAO from differential amplifier 140 and delivers an output signal LO to circuit disabling means 150. When latch circuit 660 detects a "failure," (i.e., when DAO indicates an offset between signals S1 and S2), output LO locks. Once locked, signal LO does not change, regardless of changes in DAO. The latch is advantageously designed to avoid prematurely latching during start-up, when false signals may be generated. The latch may suitably be designed for synchronous or asynchronous operation. The design and implementation of such latch circuits are within the capabilities of those skilled in the art.

It will be understood that in other embodiments, other arrangements for implementing the circuit disabler as will occur to those skilled in the art in view of the present teachings may suitably be used. In addition to using other arrangements for implementing the four "approaches" described above, additional approaches may suitably be used. For example, in addition to shorting power to ground, shorting signal to ground, disabling the clock driver and resetting the circuit, a further way to disable the circuit involves disabling the output buffer of the integrated circuit.

Radiation Sensor

Before describing an embodiment of radiation sensor 110, it will be instructive to consider the mechanism by which exposure to ionizing radiation affects the electrical characteristics of CMOS and NMOS transistors and other semiconductor devices. This mechanism is described in conjunction with FIGS. 7A–7C, which depict an n-channel transistor 702 in the prior art.

Figure 7A:
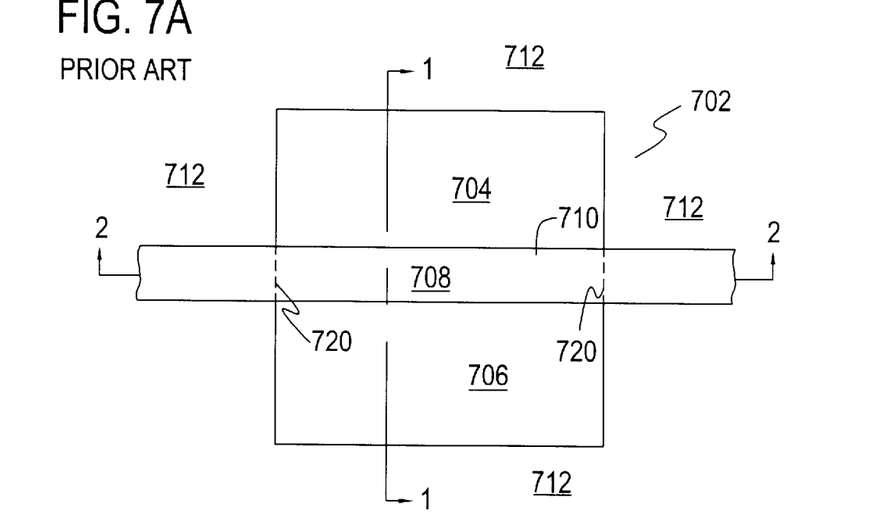
FIGS. 7A–7C depict a n-channel transistor in the prior art.

FIG. 7A depicts, via plan view, n-type drain region 704, n-type source region 706 and gate electrode 708 (typically polysilicon). Gate electrode 708 lies over a channel region 710 between drain region 704 and source region 706. Drain region 704 and source region 706 are bounded by field oxide (e.g., silicon dioxide) 712 at regions remote from gate electrode 708.

Figure 7B:
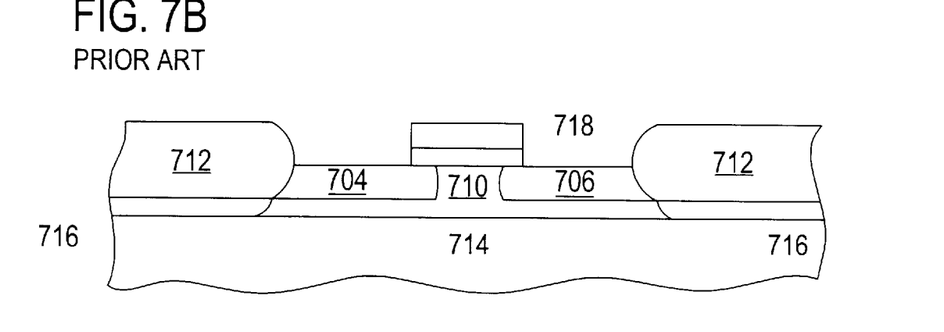

FIG. 7B is a cross-section of transistor 702 along line 1-1 (shown in FIG. 7A) as viewed in the direction indicated. FIG. 7B shows the "operating" transistor in p-type substrate 714. Gate electrode 708 overlies gate dielectric (e.g., silicon dioxide) 718.

A parasitic transistor having field oxide 712 as a gate dielectric is present in transistor 702 along the side walls of field oxide 712 at regions 720 at which gate electrode 708 extends over the edge of field oxide 712. (See FIG. 7C, which depicts a cross-section of transistor 702 along line 2—2 in FIG. 7A as viewed in the direction indicated; see also FIG. 7A.) This parasitic transistor will normally be in a non-conductive state since field oxide 712 is significantly thicker than gate dielectric 718. As such, the parasitic transistor will be off when the operating transistor is off. When the operating transistor is turned on, effectively all of the source-to-drain conduction will flow in the channel under gate dielectric 718, such that the parasitic transistor is non-conducting. Moreover, p-type regions 716 are relatively more heavily-doped than substrate 714 (e.g., silicon) to increase the threshold voltage of parasitic transistors, thereby improving the electrical isolation between neighboring transistors (not shown).

On exposure to a sufficient amount of ionizing radiation, however, the threshold voltage of the operating and parasitic transistor may shift by amounts such that the parasitic transistor will conduct when the operating transistor normally conducts. Moreover, a sufficient amount of ionizing radiation may cause the parasitic transistor to become an enhancement-mode device (i.e., conduct with zero potential difference between gate electrode 708 and source region 706). The reason for this shift in threshold voltage on exposure to ionizing radiation is explained below.

Threshold voltage is given theoretically by the equation:

$$V_T = \phi - (\sigma/\epsilon)d - F \qquad [1]$$

where: $\phi$ is the work function of the gate region;

$\sigma$ is the total charge at the dielectric(insulator)-semiconductor interface;

$\epsilon$ is the dielectric constant of the insulator;

d is the insulator thickness;

F is a term that can be considered a constant.

If, somehow, positive interface charge, $\sigma$, is added, then threshold voltage, $V_T$, decreases (because a larger number is being subtracted from $\phi$). A decrease in threshold voltage makes a n-channel device (wherein conduction carriers are electrons) easier to "turn on." It can be seen from expression [1] that with sufficient positive interface charge, $\sigma$, an n-channel device can turn on at a threshold voltage, $V_T$, equal to zero. In fact, the addition of positive interface charge can occur on exposure to ionizing radiation.

When exposed to ionizing radiation, electron-hole pairs are formed in the gate dielectric and the field oxide. Some of the holes become trapped in the gate dielectric and field oxide as various gate-induced fields sweep out the electrons as part of normal circuit operation. Since holes behave like positive charge, this phenomenon is referred to as positive-charge trapping. The trapped "positive" charges migrate toward the silicon-silicon dioxide interface, thereby adding positive interface charge, $\sigma$, and, as a consequence, decreasing the threshold voltage, $V_T$.

A dielectric having a relatively greater thickness will trap more holes than a dielectric having a relatively lesser thickness. For example, field oxide 712 will trap more positive charge than gate dielectric 718 since it is significantly thicker (e.g., about 1000 angstroms versus about 70 angstroms). More positive interface charge will therefore be added at the field oxide (712)/semiconductor interface than at the gate dielectric (718)/semiconductor interface.

Figure 7C:
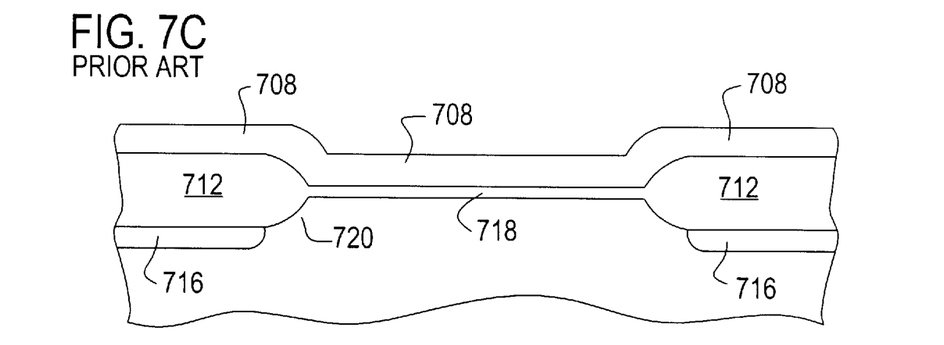

Since the field oxide "traps" more "positive" charge than the gate dielectric, and since the threshold voltage decreases as positive interface charge increases, the threshold voltage of the parasitic transistor at regions 720 will therefore shift downwardly more than will the threshold voltage of the operating transistor (i.e., the transistor having gate dielectric 718). If the dose of radiation is sufficiently great, the parasitic transistor will conduct at regions 720 (i.e., under the edge of field oxide 712) when the operating transistor normally conducts.

In accordance with the present teachings, aspects of the physical phenomena that underlie radiation susceptibility as described above are utilized to form radiation sensor 110. As previously described, in the illustrative embodiments, radiation sensor 110 comprises first device 120 and second device 130, wherein first device 120 has a greater susceptibility to ionizing radiation than second device 130. Based on this difference in radiation susceptibility, device 120 will begin to exhibit an increase in leakage current before device 130. Radiation is therefore "sensed" by the generation of an offset or difference between the output signals of the two devices.

Figure 8:
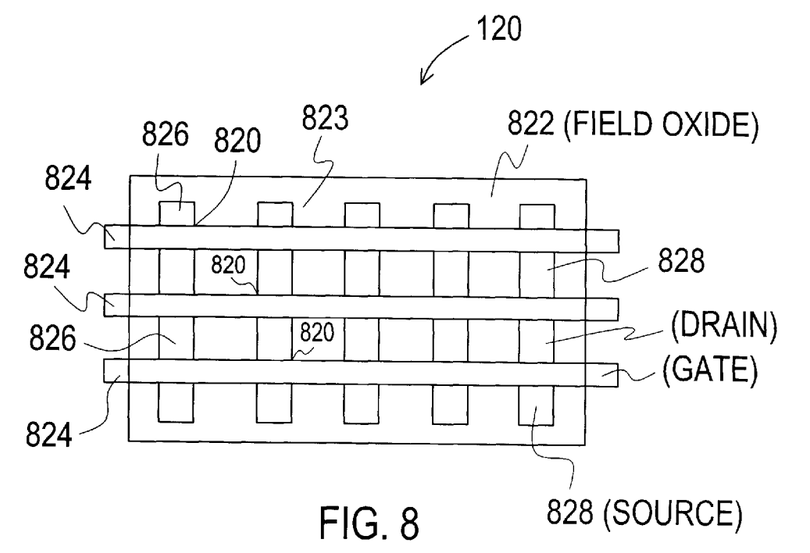
FIG. 8 depicts an illustrative embodiment of a multi-edge device that is relatively susceptible to ionizing radiation.
Figure 9:
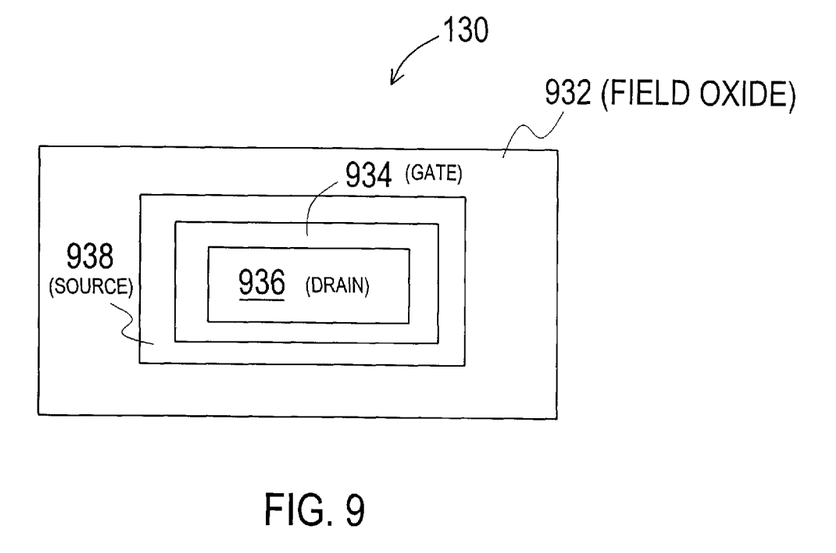
FIG. 9 depicts an illustrative embodiment of an enclosed device that is relatively tolerant to ionizing radiation.

FIGS. 8 and 9 depict illustrative embodiments of first device 120 and second device 130. FIG. 8 depicts device 120 that is relatively radiation intolerant. Illustrative device 120 depicted in FIG. 8 may be considered to be a plurality of transistors. Region 822 comprises a thick (e.g., about 1000 or more angstroms) layer of field oxide. The vertically-oriented rectangular shapes designated by the numeral "823" represent thin (e.g., about 70 angstroms) oxide regions. Regions 824 overlying thin oxide regions 823 function as a transistor gate. Regions 826 and regions 828 sandwiching gate 824 function as drain and source regions. Drain 826 is biased to power (e.g., Vdd), and gate 824 and source 828 to ground.

Recalling the earlier description of the underlying mechanism for radiation susceptibility, it will be appreciated that the large number of "edges" or "interfaces" 820 wherein gate 824 extends over field oxide region 822 renders device 120 very radiation intolerant. In particular, parasitic transistors are present at each of the many interfaces 820. And exposure to a sufficient level of ionizing radiation will "turn on" those parasitic transistors. Thus, exposure to ionizing radiation will result in a large leakage current from device 120.

On the other hand, illustrative device 130 depicted in FIG. 8 provides a very radiation tolerant configuration. Device 130 comprises drain 936, gate 934, source 938 and field oxide region 932. Drain 936 is biased to power, and gate 934 and source 938 to ground.

Device 130 has an "enclosed" configuration wherein gate 934 does not extend over field oxide region 932 at any point. As a consequence, parasitic transistors are not present, and, by virtue of their absence, device 130 is extremely resistant to ionizing radiation.

It should be understood that in other embodiments, other configurations that provide radiation tolerant and radiation intolerant devices are suitably used to implement radiation sensor 110. See, for example, applicant's previously-referenced patent application Ser. No. 09/590,805 entitled "Increasing the Susceptibility of Integrated Circuits to Ionizing Radiation", as well as co-pending patent applications Ser. No. 09/590,806 and entitled "Semiconductor Device and Circuit Having Low Tolerance To Ionizing Radiation" and Ser. No. 09/590,809 and entitled "Apparatus and Method for Manufacturing a Semiconductor Circuit", both of which were filed on even date herewith and both of which are incorporated by reference herein.

It is to be understood that the above-described embodiments are merely illustrative of the invention and that many variations may be devised by those skilled in the art without departing from the scope of the invention and from the principles disclosed herein. It is therefore intended that such variations be included within the scope of the following claims and their equivalents.

We claim:

1. An integrated circuit comprising:
   a radiation sensor that senses ionizing radiation by generating a first signal having a first value and a second signal having a second value, wherein said first value and said second value change differently from one another when said radiation sensor is exposed to ionizing radiation;
   a differential amplifier electrically connected to said radiation sensor, wherein the differential amplifier is operable to:
   receive said first signal and said second signal; and
   generate a third signal having a value that is a function of said first and second signals; and
   a circuit disabler electrically connected to said differential amplifier, wherein said circuit disabler is operable to:
   receive said third signal; and
   permanently disable said integrated circuit or not disable it responsive to said value of said third signal.

2. The integrated circuit of claim 1 wherein said function is a difference between said first value and said second value.

3. The integrated circuit of claim 2 wherein said radiation sensor comprises:
   a first device operable to generate said first signal, wherein said first value of said first signal changes when said first device absorbs a total dose of ionizing radiation that exceeds a radiation tolerance of said first device; and
   a second device operable to generate said second signal; wherein said second value of said second signal changes when said second device absorbs a total dose of ionizing radiation that exceeds a radiation tolerance of said second device;
   wherein said second device is more tolerant to ionizing radiation than said first device.

4. The integrated circuit of claim 3 wherein said first device is a multi-edge device comprising a plurality of interfaces at which a gate oxide region abuts a field oxide region.

5. The integrated circuit of claim 4 wherein said first device is a transistor.

6. The integrated circuit of claim 3 wherein said second device is an enclosed device comprising a gate oxide that does not abut a field oxide region.

7. The integrated circuit of claim 6 wherein said second device is a transistor.

8. The integrated circuit of claim 1 wherein said circuit disabler comprises a switching transistor, wherein:
   a gate of said switching transistor is operable to receive said third signal;
   a source of said switching transistor is electrically connected to ground; and
   a drain of said switching transistor is electrically connected to power.

9. The integrated circuit of claim 1 wherein said circuit disabler comprises a switching transistor, wherein:
   a gate of said switching transistor is operable to receive said third signal;
   a source of said switching transistor is electrically connected to ground; and
   a drain of said switching transistor is electrically connected to a signal line that carries information bearing signals.

10. The integrated circuit of claim 1 wherein said circuit disabler comprises an AND gate having:
    a first input that is operable to receive a master clock signal;
    a second input that is operable to receive said third signal; and
    an output that is electrically connected to a clock driver.

11. The integrated circuit of claim 1 further comprising a latch circuit, wherein:

said latch circuit is operable to receive said third signal and is further operable to deliver a fourth signal to said circuit disabler; and said latch circuit is operable to lock said fourth signal when said value of said third signal will cause said circuit disabler to disable said integrated circuit;

and further wherein said circuit disabling means comprises an AND gate having:

a first input that is operable to receive a master clock signal;

a second input that is operable to receive said fourth signal; and an output that is electrically connected to a clock driver.

12. The integrated circuit of claim 1 wherein said circuit disabler comprises an OR gate having:

a first input that is electrically connected to an external reset;

a second input that is operable to receive said third signal; and an output that is electrically connected to an internal reset.

13. The integrated circuit of claim 1 further comprising a latch circuit, wherein:

said latch circuit is operable to receive said third signal and is further operable to deliver a fourth signal to said circuit-disabling means; and said latch circuit is operable to lock said fourth signal when said value of said third signal will cause said circuit disabler to disable said integrated circuit;

and further wherein said circuit disabler comprises an OR gate having:

a first input that is electrically connected to an external reset;

a second input that is operable to receive said fourth signal; and an output that is electrically connected to an internal reset.

14. An article comprising:

a radiation sensor comprising a first device and a second device, wherein said second device is more tolerant to ionizing radiation than said first device; and a differential amplifier electrically connected to said radiation sensor, wherein said differential amplifier is operable to receive a first signal from said first device and a second signal from said second device and is further operable to generate a third signal having a value that is a function of said first and second signals.

15. A method comprising:

comparing a first signal indicative of a first current leakage with a second signal indicative of a second current leakage, wherein said first current leakage and said second current leakage are indicative of an amount of exposure to ionizing radiation;

generating a third signal that:

has a first value when a difference between said first signal and said second signal meets or exceeds a threshold difference, and has a second value when a difference between said first signal and said second signal is less than said threshold difference permanently disables an integrated circuit when said third signal has said first value and not disabling said integrated circuit when said third signal has said second value.

16. The method of claim 15 further comprising exposing a first device and a second device to ionizing radiation, wherein:

said first device has a first tolerance to said ionizing radiation;

said second device has a second tolerance to said ionizing radiation; and said second tolerance is greater than said first tolerance.

17. The method of claim 15 wherein said integrated circuit is disabled by turning on a transistor that couples power to ground.

18. The method of claim 15 wherein said integrated circuit is disabled by turning on a transistor that couples signals to ground.

19. The method of claim 15 wherein said integrated circuit is disabled by preventing a master clock signal from being transmitted to a clock driver.

20. The method of claim 15 wherein said integrated circuit is disabled by asserting chip reset.

21. A method comprising:

sensing ionizing radiation; and permanently disabling operation of an integrated circuit when said ionizing radiation received by said integrated circuit exceeds a first total dose.

22. The method of claim 21 wherein said step of sensing further comprises generating a disabler signal when said first total dose is exceeded, which disabler signal triggers said disabling operation.

23. The method of claim 22 wherein said step of sensing further comprises generating a first signal and a second signal.

24. The method of claim 23 wherein said step of disabling further comprises comparing said first signal and said second signal.

25. The method of claim 24 wherein said disabler signal is generated when a difference between said first signal and said second signal meets or exceeds a threshold value, which threshold value is indicative that said first total dose is exceeded.

26. A method comprising:

fabricating an integrated circuit comprising a first device having a first tolerance to ionizing radiation and a second device having a second tolerance to ionizing radiation, wherein said second tolerance is greater than said first tolerance;

electrically connecting an output of said first device to a first input of a differential amplifier and electrically connecting an output of said second device to a second input of said differential amplifier; and electrically connecting an output of said differential amplifier to a circuit disabling means which permanently disables said integrated circuit.

27. The method of claim 26 wherein said output of said differential amplifier is electrically connected to said circuit disabling means through a second amplifier.

* * * * *